United States Patent
Liu et al.

(10) Patent No.: US 12,183,409 B2
(45) Date of Patent: Dec. 31, 2024

(54) SHIFT REGISTER UNIT AND DRIVING METHOD THEREFOR, GATE DRIVE CIRCUIT, AND DISPLAY DEVICE

(71) Applicant: BOE Technology Group Co., Ltd., Beijing (CN)

(72) Inventors: Fengjuan Liu, Beijing (CN); Ce Ning, Beijing (CN); Wei Liu, Beijing (CN); Dini Xie, Beijing (CN); Yuhang Lu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/909,129

(22) PCT Filed: Oct. 25, 2021

(86) PCT No.: PCT/CN2021/126094
§ 371 (c)(1),
(2) Date: Sep. 2, 2022

(87) PCT Pub. No.: WO2022/193658
PCT Pub. Date: Sep. 22, 2022

(65) Prior Publication Data
US 2024/0212773 A1     Jun. 27, 2024

(30) Foreign Application Priority Data
Mar. 16, 2021    (CN) .......................... 202110280954.2

(51) Int. Cl.
*G11C 19/28*     (2006.01)
*G09G 3/20*     (2006.01)

(52) U.S. Cl.
CPC .......... *G11C 19/28* (2013.01); *G09G 3/2092* (2013.01); *G09G 2300/0842* (2013.01); *G09G 2310/0267* (2013.01); *G09G 2310/0286* (2013.01)

(58) Field of Classification Search
CPC ......... G09G 2310/0286; G09G 3/3266; G09G 2310/0289; G09G 2310/0267; G09G 2310/0281; G09G 3/3674
See application file for complete search history.

(56) References Cited

U.S. PATENT DOCUMENTS

| | | | |
|---|---|---|---|
| 2011/0012823 A1* | 1/2011 | Tsai .................. | G11C 19/28 377/79 |
| 2021/0210017 A1 | 7/2021 | Feng et al. | |

(Continued)

FOREIGN PATENT DOCUMENTS

| | | | | |
|---|---|---|---|---|
| CN | 109935198 A | * | 6/2019 | |
| CN | 109935209 A | * | 6/2019 | ............... G09G 3/20 |

(Continued)

OTHER PUBLICATIONS

CN202110280954.2 first office action.

*Primary Examiner* — Koosha Sharifi-Tafreshi
(74) *Attorney, Agent, or Firm* — IPro, PLLC

(57) ABSTRACT

Provided is a shift register unit. The shift register unit includes an input circuit, a compensation control circuit, and an output circuit; wherein input circuit coupled to an input signal terminal, an input control terminal, a first power supply terminal, a reference node, and a first node; the compensation control circuit coupled to a first clock signal terminal, the reference node, and the first node; and the output circuit coupled to the first node, a second clock signal terminal, and an output terminal.

20 Claims, 10 Drawing Sheets

(56) References Cited

U.S. PATENT DOCUMENTS

2021/0335198 A1   10/2021   Feng
2021/0358417 A1   11/2021   Feng et al.
2021/0375211 A1   12/2021   Feng et al.

FOREIGN PATENT DOCUMENTS

| | | | | |
|---|---|---|---|---|
| CN | 110061035 A | * | 7/2019 | ........... G09G 3/3225 |
| CN | 111971737 A | | 11/2020 | |
| CN | 112133254 A | * | 12/2020 | ............... G09G 3/20 |
| CN | 113053447 A | | 6/2021 | |
| KR | 20100040678 A | * | 4/2010 | ........... G09G 3/3677 |
| WO | 2020001012 A1 | | 1/2020 | |

* cited by examiner

In an input phase, an input circuit transmits a first power signal provided by a first power supply terminal to a reference node in response to an input signal provided by an input signal terminal and an input control signal provided by an input control terminal, and transmits the first power signal to a first node in response to the input signal, wherein a potential of the input signal and a potential of the input control signal are both a first potential ~1101

In an output phase, an output circuit transmits a second clock signal provided by a second clock signal terminal to an output terminal in response to a potential of the first node, wherein the potential of the first node is the first potential ~1102

In a first pull-down phase, a pull-down circuit transmits a second power signal provided by a second power supply terminal to the first node in response to a pull-down control signal provided by a pull-down control terminal, a pull-down control circuit transmits the second power signal to a second node in response to the first power signal and the potential of the first node, and the pull-down circuit further transmits the second power signal to the first node and a shift output terminal and transmits a third power signal provided by a third power supply terminal to a drive output terminal in response to a potential of the second node, wherein a potential of the pull-down control signal is the first potential ~1104

In a compensation control phase, a compensation control circuit adjusts the potential of the first node based on a potential of the reference node in response to a first clock signal provided by a first clock signal terminal, wherein a potential of the first clock signal is the first potential ~1103

In a second pull-down phase, the pull-down circuit transmits the second power signal to the reference node in response to a reset signal provided by a reset signal terminal, and the compensation control circuit adjusts the potential of the first node based on the potential of the reference node in response to the first clock signal, wherein a potential of the reset signal and the potential of the first clock signal are both the first potential ~1105

FIG. 12

SHIFT REGISTER UNIT AND DRIVING METHOD THEREFOR, GATE DRIVE CIRCUIT, AND DISPLAY DEVICE

CROSS-REFERENCE TO RELATED APPLICATION

The present disclosure is a U.S. national stage of international application No. PCT/CN2021/126094, filed on Oct. 25, 2021, which claims priority to Chinese Patent Application No. 202110280954.2, filed on Mar. 16, 2021, and entitled "SHIFT REGISTER UNIT AND DRIVING METHOD THEREFOR, GATE DRIVE CIRCUIT, AND DISPLAY DEVICE", the disclosures of which are herein incorporated by reference in their entireties.

TECHNICAL FIELD

The present disclosure relates to the field of display technologies, and in particular relates to a shift register unit and a driving method therefore, a gate drive circuit, and a display device.

BACKGROUND

A shift register generally includes a plurality of cascaded shift register units. Each shift register unit is configured to drive a row of pixel units. The plurality of cascaded shift register units can drive pixel units in a display device row by row to display an image.

SUMMARY

The present disclosure provides a shift register unit and a driving method therefore, a gate drive circuit, and a display device. The technical solutions are as follows.

According to some embodiments, a shift register unit is provided. The shift register unit includes:
  an input circuit coupled to an input signal terminal, an input control terminal, a first power supply terminal, a reference node, and a first node, wherein the input circuit is configured to transmit a first power signal provided by the first power supply terminal to the reference node in response to an input signal provided by the input signal terminal and an input control signal provided by the input control terminal, and transmit the first power signal to the first node in response to the input signal;
  a compensation control circuit coupled to a first clock signal terminal, the reference node, and the first node, wherein the compensation control circuit is configured to adjust a potential of the first node based on a potential of the reference node in response to a first clock signal provided by the first clock signal terminal; and
  an output circuit coupled to the first node, a second clock signal terminal, and an output terminal, wherein the output circuit is configured to transmit a second clock signal provided by the second clock signal terminal to the output terminal in response to the potential of the first node.

Optionally, at least one of a transistor in the input circuit, a transistor in the compensation control circuit, and a transistor in the output circuit includes a top gate and a bottom gate coupled to each other.

Optionally, at least one of a transistor in the input circuit, a transistor in the compensation control circuit, and a transistor in the output circuit includes a target metal coupled to a source.

Optionally, the input circuit includes a first input sub-circuit and a second input sub-circuit; wherein
  the first input sub-circuit is coupled to the input signal terminal, the input control terminal, the first power supply terminal, and the reference node, and is configured to transmit the first power signal to the reference node in response to the input signal and the input control signal; and
  the second input sub-circuit is coupled to the input signal terminal, the first power supply terminal, and the first node, and is configured to transmit the first power signal to the first node in response to the input signal.

Optionally, the first input sub-circuit includes a first input transistor and a second input transistor; and the second input sub-circuit includes a third input transistor; wherein
  a gate of the first input transistor is coupled to the input signal terminal, a first electrode of the first input transistor is coupled to the first power supply terminal, and a second electrode of the first input transistor is coupled to a first electrode of the second input transistor;
  a gate of the second input transistor is coupled to the input control terminal and a second electrode of the second input transistor is coupled to the reference node; and
  a gate of the third input transistor is coupled to the input signal terminal, a first electrode of the third input transistor is coupled to the first power supply terminal, and a second electrode of the third input transistor is coupled to the first node.

Optionally, the compensation control circuit includes a compensation control transistor; wherein
  a gate of the compensation control transistor is coupled to the first clock signal terminal, a first electrode of the compensation control transistor is coupled to the reference node, and a second electrode of the compensation control transistor is coupled to the first node.

Optionally, the shift register unit further includes a potential storage circuit; wherein
  the potential storage circuit is coupled to the reference node and a second power supply terminal, and is configured to store the potential of the reference node under control of the potential of the reference node and a second power signal provided by the second power supply terminal.

Optionally, the potential storage circuit includes a storage capacitor; wherein
  one terminal of the storage capacitor is coupled to the reference node and the other terminal of the storage capacitor is coupled to the second power supply terminal.

Optionally, the output terminal includes a shift output terminal and a drive output terminal; the second clock signal terminal includes a first clock sub-signal terminal and a second clock sub-signal terminal; and the output circuit includes a first output sub-circuit and a second output sub-circuit; wherein
  the first output sub-circuit is coupled to the first node, the first clock sub-signal terminal, and the shift output terminal, and is configured to transmit a first clock sub-signal provided by the first clock sub-signal terminal to the shift output terminal in response to the potential of the first node; and the second output sub-circuit is coupled to the first node, the second clock sub-signal terminal, and the drive output terminal, and is configured to transmit a second clock sub-signal provided by the second clock sub-signal terminal to the drive output terminal in response to the potential of the first node.

Optionally, the output terminal includes a shift output terminal and a drive output terminal; and the shift register unit further includes a pull-down control circuit and a pull-down circuit; wherein the pull-down control circuit is coupled to the first power supply terminal, the first node, a second power supply terminal, and a second node, and is configured to transmit the first power signal to the second node in response to the first power signal, and transmit a second power signal provided by the second power supply terminal to the second node in response to the potential of the first node; and the pull-down circuit is coupled to a reset signal terminal, a pull-down control terminal, the second node, the second power supply terminal, a third power supply terminal, the reference node, the first node, the shift output terminal, and the drive output terminal, and is configured to transmit the second power signal to the reference node in response to a reset signal provided by the reset signal terminal, transmit the second power signal to the first node in response to a pull-down control signal provided by the pull-down control terminal, and transmit the second power signal to the first node and the shift output terminal and transmit a third power signal provided by the third power supply terminal to the drive output terminal in response to a potential of the second node;

wherein at least one transistor in the pull-down circuit includes a top gate and a bottom gate coupled to each other or includes a target metal coupled to a source.

Optionally, the transistor including the top gate and the bottom gate coupled to each other or the transistor including the target metal coupled to the source in the shift register unit includes at least one type of the following transistors:

transistors configured to control the potential of the first node in the input circuit and the pull-down circuit;

a transistor configured to control the potential of the reference node in the pull-down circuit; and transistors in the output circuit.

Optionally, a channel length of a target transistor, coupled to the first power supply terminal, in the pull-down control circuit is greater than channel lengths of transistors except the target transistor in the shift register unit.

According to some embodiments, a method for driving a shift register unit is provided. The method is applied to drive the shift register unit described in the above aspect. The method includes:

in an input period, transmitting, by an input circuit, a first power signal provided by a first power supply terminal to a reference node in response to an input signal provided by an input signal terminal and an input control signal provided by an input control terminal, and transmitting, by the input circuit, the first power signal to a first node in response to the input signal, wherein a potential of the input signal, a potential of the input control signal, and a potential of the first power signal are all a first potential;

in an output period, transmitting, by an output circuit, a second clock signal provided by a second clock signal terminal to an output terminal in response to a potential of the first node, wherein the potential of the first node is the first potential; and in a compensation control period, adjusting, by a compensation control circuit, the potential of the first node based on a potential of the reference node in response to a first clock signal provided by a first clock signal terminal, wherein a potential of the first clock signal is the first potential;

wherein the input period and the output period are performed in a display stage, and the compensation control period is performed in a blanking stage.

Optionally, the output terminal includes a shift output terminal and a drive output terminal; and the method further includes:

in a first pull-down period, transmitting, by a pull-down circuit, a second power signal provided by a second power supply terminal to the first node in response to a pull-down control signal provided by a pull-down control terminal; transmitting, by a pull-down control circuit, the second power signal to a second node in response to the first power signal and the potential of the first node; and further transmitting, by the pull-down circuit, the second power signal to the first node and the shift output terminal and a third power signal provided by a third power supply terminal to the drive output terminal in response to a potential of the second node, wherein a potential of the pull-down control signal is the first potential, and a potential of the third power signal is a third potential; and in a second pull-down period, transmitting, by the pull-down circuit, the second power signal to the reference node in response to a reset signal provided by a reset signal terminal; and adjusting, by the compensation control circuit, the potential of the first node based on the potential of the reference node in response to the first clock signal, wherein a potential of the reset signal and the potential of the first clock signal are both the first potential;

wherein the first pull-down period is performed in the display stage and after the output period; and the second pull-down period is performed in the blanking stage and after the compensation control period.

According to some embodiments, a gate drive circuit is provided. The gate drive circuit includes at least two cascaded shift register units described in the above aspect.

According to some embodiments, a display device is provided. The display device includes a display panel and the gate drive circuit described in the above aspect.

The gate drive circuit is coupled to a pixel circuit in the display panel, and is configured to provide a gate drive signal to the pixel circuit.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

FIG. 12 is a flowchart of another method for driving a shift register unit according to some embodiments of the present disclosure;

DETAILED DESCRIPTION

Figure 1:
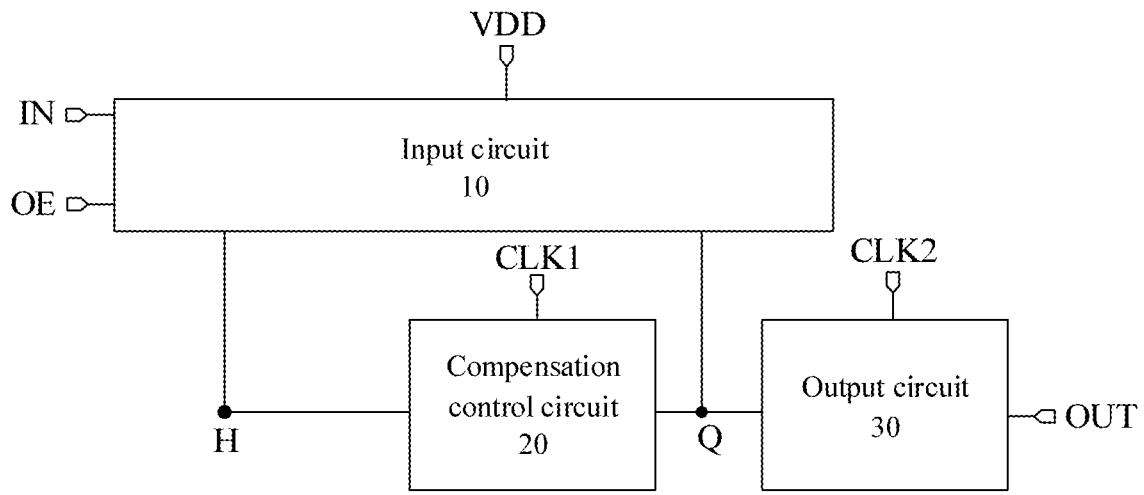
FIG. 1 is a schematic structural diagram of a shift register unit according to some embodiments of the present disclosure.

To make the objectives, technical solutions, and advantages of the present disclosure clearer, embodiments of the present disclosure will be further described in detail below with reference to the accompanying drawings.

Transistors in all embodiments of the present disclosure are thin film transistors, field effect transistors, or other devices having the same characteristics. The transistors in the embodiments of the present disclosure are mainly switching transistors based on their functions in circuits. Because a source and drain of the switching transistor are symmetrical, the source and drain are interchangeable. In the embodiments of the present disclosure, the source is referred to as a first terminal and the drain is referred to as a second terminal, or the drain is referred to as the first terminal and the source is referred to as the second terminal. According to the form in the accompanying drawings, a middle terminal of the transistor is a gate, a signal input terminal is the source, and a signal output terminal is the drain. In addition, the switching transistor in the embodiments of the present disclosure is a P-type switching transistor or an N-type switching transistor. The P-type switching transistor is turned on when the gate is at a low level and turned off when the gate is at a high level. The N-type switching transistor is turned on when the gate is at the high level and turned off when the gate is at the low level. In addition, a plurality of signals in the embodiments of the present disclosure each have a first potential and a second potential. The first potential and the second potential only represent that the potential of the signal has two different state variables, but do not represent that the first potential or the second potential in the whole text has a specific value.

In the field of display technologies, gate driver on array (GOA) circuits formed by using a GOA technology have been widely used. The GOA circuit is obtained by integrating on an array substrate a gate drive circuit configured to provide gate drive signals for gate lines. The GOA circuit is referred to as a shift register. The GOA circuit usually includes a plurality of cascaded shift register units, and each shift register unit is coupled to one of the gate lines on the array substrate and configured to provide the gate drive signal to the coupled gate line. Coupling refers to an electrical connection.

In the related art, the shift register unit usually includes an input circuit, an output circuit, a pull-down control circuit, and a pull-down circuit. The input circuit is configured to charge a first node based on the drive signal output by the cascaded shift register unit at a previous stage. The output circuit is configured to output the drive signal to an output terminal coupled to the gate line under control of the first node. The pull-down control circuit is configured to control a potential of a second node. The pull-down circuit is configured to pull down the potential and reduce noise for on the first node and the output terminal under control of the second node.

However, the potential of the first node of the shift register unit is controlled only by the input circuit in the related art, and thus the flexibility of controlling the potential of the first node is poor. As a result, the flexibility of outputting the drive signal by the output circuit under the control of the first node is poor. Thus, the shift register unit outputs the gate drive signal to the coupled gate line in a display stage only to drive a pixel coupled to the gate line to emit light, but does not output the gate drive signal to the coupled gate line in a blanking stage, which is inconvenient for an external compensation circuit coupled to the pixel to perform reliable external compensation on the pixel in the blanking stage. Assuming that the gate drive signal for driving the pixel to emit light in the display stage is referred to as a display drive signal, and the gate drive signal for externally compensating the pixel by the external compensation circuit in the blanking stage is referred to as a compensation drive signal, then in the related art, it is very difficult for the shift register unit to output the display drive signal and the compensation drive signal having different cycles and different pulse widths.

The embodiments of the present disclosure provide a shift register unit capable of reliably outputting a display drive signal and a compensation drive signal having different cycles and different pulse widths.

FIG. 1 is a schematic structural diagram of a shift register unit according to some embodiments of the present disclosure. As shown in FIG. 1, the shift register unit includes an input circuit 10, a compensation control circuit 20, and an output circuit 30.

The input circuit 10 is coupled to an input signal terminal IN, an input control terminal OE, a first power supply terminal VDD, a reference node H, and a first node Q. The input circuit 10 is configured to transmit a first power signal provided by the first power supply terminal VDD to the reference node H in response to an input signal provided by the input signal terminal IN and an input control signal provided by the input control terminal OE, and transmit the first power signal to the first node Q in response to the input signal.

For example, the input circuit 10 transmits the first power signal provided by the first power supply terminal VDD to the reference node H when a potential of the input signal provided by the input signal terminal IN and a potential of the input control signal provided by the input control terminal OE are both a first potential. In addition, the input circuit 10 transmits the first power signal to the first node Q only when the potential of the input signal is the first potential. In some embodiments of the present disclosure, a potential of the first power signal is the first potential, and the first potential is a valid potential.

The compensation control circuit 20 is coupled to a first clock signal terminal CLK1, the reference node H, and the first node Q. The compensation control circuit 20 is configured to adjust a potential of the first node Q based on a potential of the reference node H in response to a first clock signal provided by the first clock signal terminal CLK1.

For example, the compensation control circuit 20 controls the reference node H to be conducted with the first node Q when a potential of the first clock signal provided by the first clock signal terminal CLK1 is the first potential, and adjust the potential of the first node Q based on the potential of the reference node H. For example, the compensation control circuit 20 transmits the potential of the reference node H to the first node Q.

It can be learned from the coupling manners and functions of the input circuit 10 and the compensation control circuit 20 that in some embodiments of the present disclosure, the potential of the first node Q is directly controlled by the input circuit 10 only. For example, only the input circuit 10 transmits the first power signal at the first potential to the first node Q in response to the input signal to charge the first node Q. Alternatively, the potential of the first node Q is controlled by both the input circuit 10 and the compensation control circuit 20. For example, the input circuit 10 first transmits the first power signal at the first potential to the reference node H in response to the input signal and the input control signal; and then the compensation control circuit 20 transmits the first power signal at the first potential transmitted to the reference node H to the first node Q, thereby charging the first node Q. In this way, the flexibility of controlling the first node Q is effectively improved. In addition, the flexibility and reliability of controlling the reference node H are improved by setting the input circuit 10 to control the potential of the reference node H in response to the input signal and the input control signal.

The output circuit 30 is coupled to the first node Q, a second clock signal terminal CLK2, and an output terminal OUT. The output circuit 30 is configured to transmit a second clock signal provided by the second clock signal terminal CLK2 to the output terminal OUT in response to the potential of the first node Q.

For example, the output circuit 30 transmits the second clock signal provided by the second clock signal terminal CLK2 to the output terminal OUT when the potential of the first node Q is the first potential. The output terminal OUT is coupled to a gate line.

Based on the foregoing analysis, on the premise of improving the flexibility of controlling the first node Q, the flexibility of outputting the signal to the output terminal OUT by the output circuit 30 in response to the potential of the first node Q is correspondingly improved. In this way, the output circuit 30 outputs a display drive signal to the coupled gate line in a display stage and output a compensation drive signal to the coupled gate line in a blanking stage by flexibly setting the potentials at the signal terminals coupled to various circuits.

For example, the display stage usually includes an input period and an output period. In the input period, the input signal terminal IN is set to provide the input signal at the first potential, the input control terminal OE is set to provide the input control signal at the first potential, and the first clock signal terminal CLK1 is set to provide the first clock signal at a second potential. The second potential is an invalid potential. In this way, the input circuit 10 transmits the first power signal at the first potential to both the first node Q and the reference node H in response to the input signal at the first potential and the input control signal at the first potential. In addition, the compensation control circuit 20 does not transmit the potential of the reference node H to the first node Q. Further, in the output period, the output circuit 30 outputs the second clock signal (i.e., the display drive signal) to the output terminal OUT only under the control of the first potential of the first node Q. In the blanking stage after the display stage is performed, the first clock signal terminal CLK1 is set to provide the first clock signal at the first potential. In this way, the compensation control circuit 20 transmits the first potential of the reference node H to the first node Q. Then, the output circuit 30 outputs the second clock signal (i.e., the compensation drive signal) to the output terminal OUT under the control of the first node Q.

Optionally, in the embodiments of the present disclosure, the valid potential is a high potential relative to the invalid potential; or the valid potential is a low potential relative to the invalid potential.

In summary, some embodiments of the present disclosure provide a shift register unit. The shift register unit includes the input circuit, the compensation control circuit, and the output circuit. The input circuit controls the potential of the first node under control of the input signal provided by the input signal terminal and control the potential of the reference node under control of the input signal and the input control signal provided by the input control terminal. The compensation control circuit adjusts the potential of the first node based on the potential of the reference node under control of the first clock signal provided by the first clock signal terminal. In this way, the flexibility of controlling the first node is improved, such that the output circuit flexibly outputs the drive signal to the output terminal coupled to the gate line under control of the first node.

Figure 2:
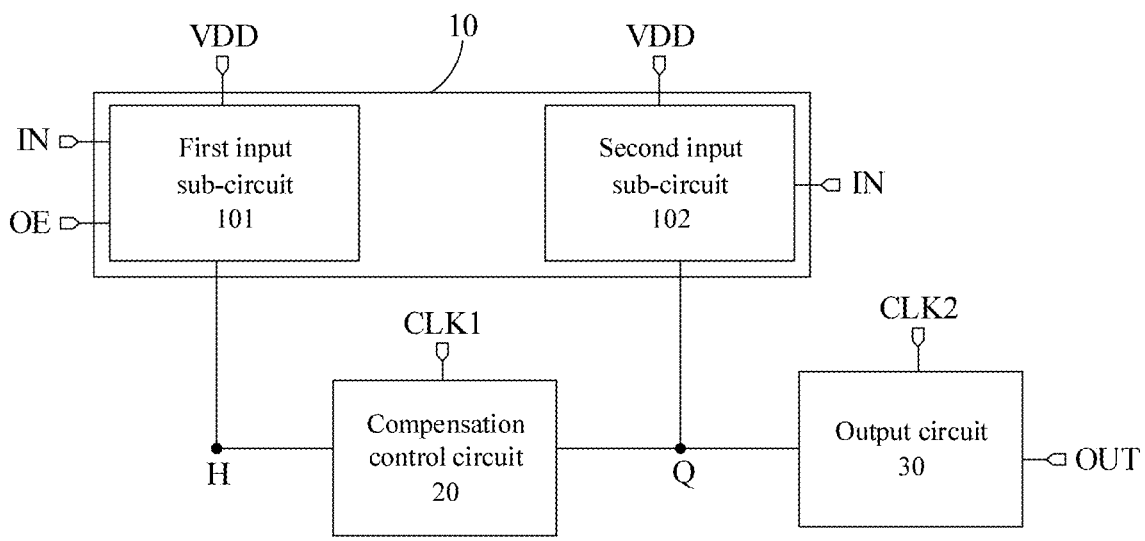
FIG. 2 is a schematic structural diagram of another shift register unit according to some embodiments of the present disclosure.

FIG. 2 is a schematic structural diagram of another shift register unit according to some embodiments of the present disclosure. As shown in FIG. 2, the input circuit 10 includes a first input sub-circuit 101 and a second input sub-circuit 102.

The first input sub-circuit 101 is coupled to the input signal terminal IN, the input control terminal OE, the first power supply terminal VDD, and the reference node H. The first input sub-circuit 101 is configured to transmit the first power signal to the reference node H in response to the input signal and the input control signal.

For example, the first input sub-circuit 101 transmits the first power signal at the first potential to the reference node H to charge the reference node H when the potential of the input signal and the potential of the input control signal are both the first potential.

The second input sub-circuit 102 is coupled to the input signal terminal IN, the first power supply terminal VDD, and the first node Q. The second input sub-circuit 102 is configured to transmit the first power signal to the first node Q in response to the input signal.

For example, the second input sub-circuit 101 transmits the first power signal at the first potential to the first node Q to charge the first node Q when the potential of the input signal is the first potential.

Figure 3:
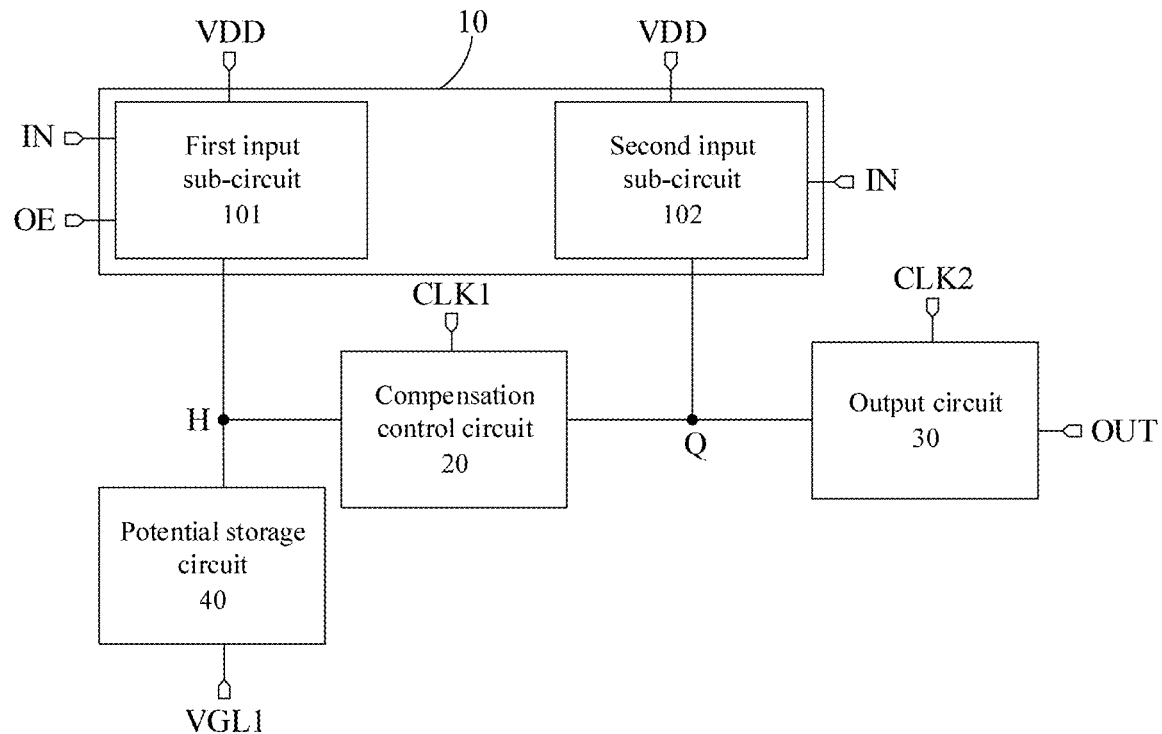
FIG. 3 is a schematic structural diagram of still another shift register unit according to some embodiments of the present disclosure.

FIG. 3 is a schematic structural diagram of still another shift register unit according to some embodiments of the present disclosure. As shown in FIG. 3, the shift register unit further includes a potential storage circuit 40.

The potential storage circuit 40 is coupled to the reference node H and a second power supply terminal VGL1. The potential storage circuit 40 is configured to store the potential of the reference node H under control of the potential of the reference node H and a second power signal provided by the second power supply terminal VGL1.

Optionally, a potential of the second power signal is the second potential. By providing the potential storage circuit 40, the potential of the reference node H is reliably stored between the input period and the blanking stage.

Figure 4:
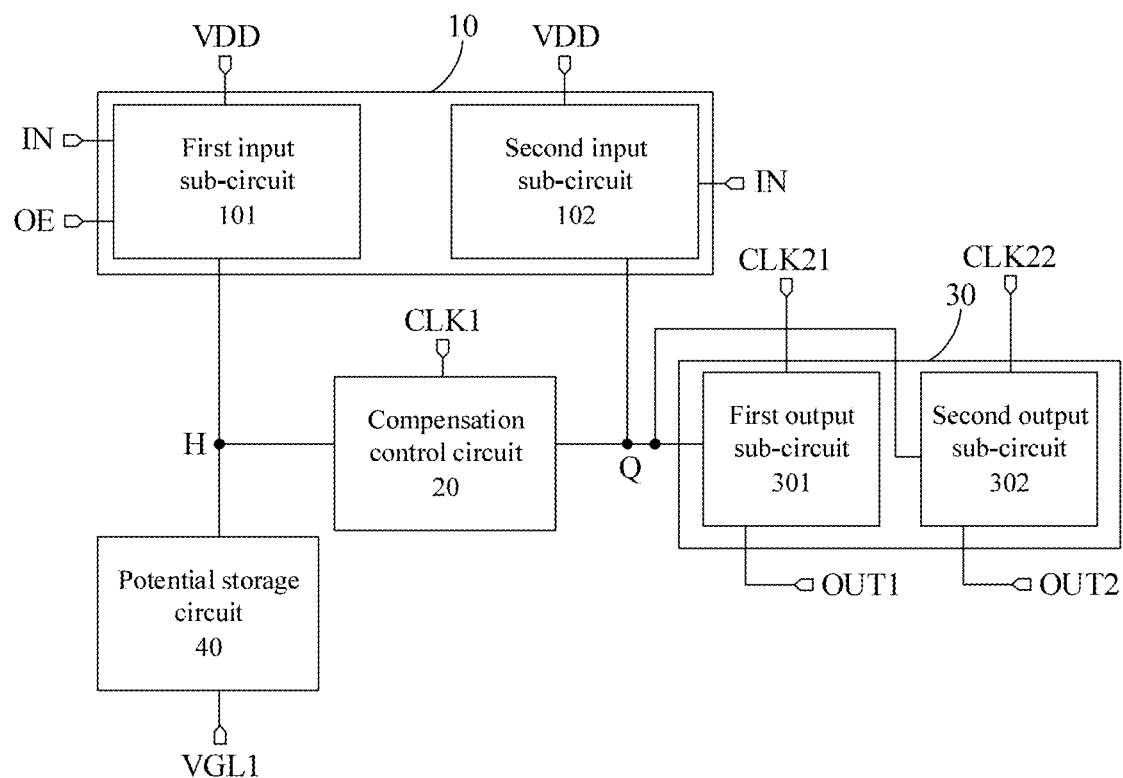
FIG. 4 is a schematic structural diagram of still another shift register unit according to some embodiments of the present disclosure.

FIG. 4 is a schematic structural diagram of still another shift register unit according to some embodiments of the present disclosure. As shown in FIG. 4, the output terminal OUT according to the embodiments of the present disclosure includes a shift output terminal OUT1 and a drive output terminal OUT2. For a shift register unit at an intermediate stage, the shift output terminal OUT1 is coupled to the input signal terminal IN of a cascaded shift register unit at a previous stage. The drive output terminal OUT2 is coupled to a gate line. Referring to FIG. 4, the second clock signal terminal CLK2 includes a first clock sub-signal terminal CLK21 and a second clock sub-signal terminal CLK22. The output circuit 30 includes a first output sub-circuit 301 and a second output sub-circuit 302.

The first output sub-circuit 301 is coupled to the first node Q, the first clock sub-signal terminal CLK21, and the shift output terminal OUT1. The first output sub-circuit 301 is configured to transmit a first clock sub-signal provided by the first clock sub-signal terminal CLK21 to the shift output terminal OUT1 in response to the potential of the first node Q.

For example, the first output sub-circuit 301 transmits the first clock sub-signal provided by the first clock sub-signal terminal CLK21 to the shift output terminal OUT1 when the potential of the first node Q is the first potential.

The second output sub-circuit 302 is coupled to the first node Q, the second clock sub-signal terminal CLK22, and the drive output terminal OUT2. The second output sub-circuit 302 is configured to transmit a second clock sub-signal provided by the second clock sub-signal terminal CLK22 to the drive output terminal OUT2 in response to the potential of the first node Q.

For example, the second output sub-circuit 302 transmits the second clock sub-signal provided by the second clock sub-signal terminal CLK22 to the drive output terminal OUT2 when the potential of the first node Q is the first potential.

Figure 5:
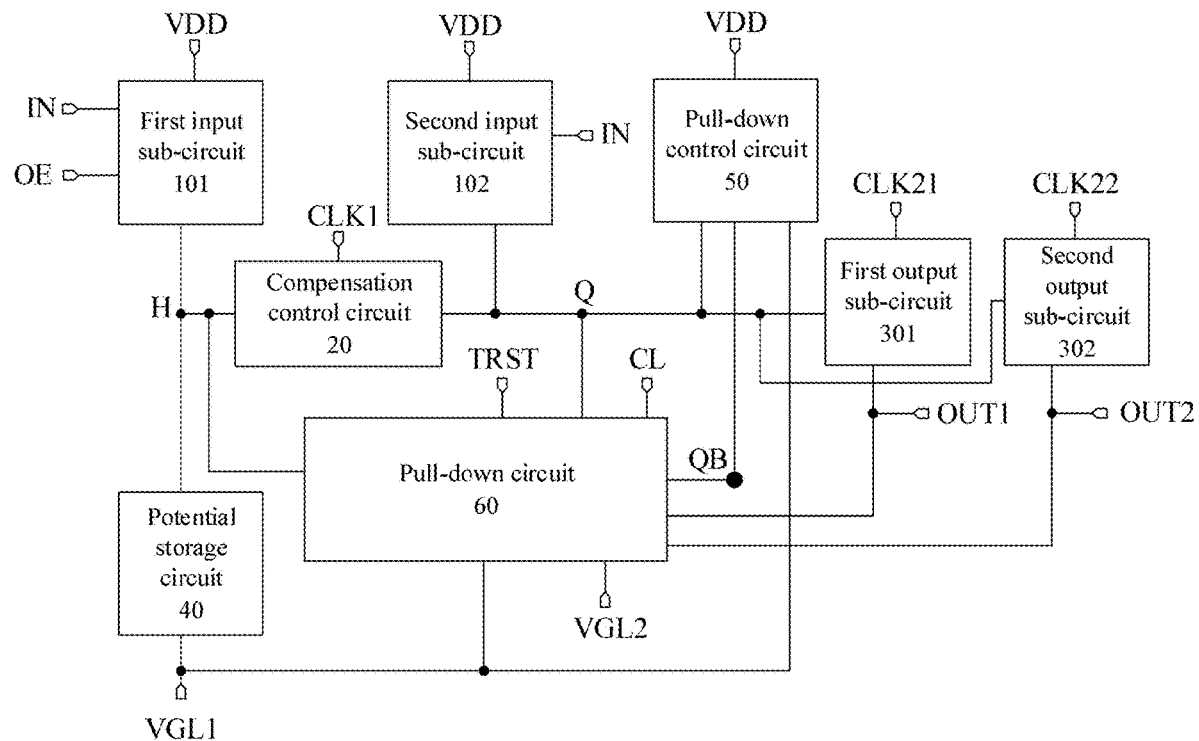
FIG. 5 is a schematic structural diagram of still another shift register unit according to some embodiments of the present disclosure.

On the basis of the structure shown in FIG. 4, FIG. 5 is a schematic structural diagram of still another shift register unit according to some embodiments of the present disclosure. As shown in FIG. 5, the shift register unit further includes a pull-down control circuit 50 and a pull-down circuit 60.

The pull-down control circuit 50 is coupled to the first power supply terminal VDD, the first node Q, the second power supply terminal VGL1, and a second node QB. The pull-down control circuit 50 is configured to transmit the first power signal to the second node QB in response to the first power signal, and transmit the second power signal provided by the second power supply terminal VGL1 to the second node QB in response to the potential of the first node Q.

For example, the pull-down control circuit 50 transmits the first power signal at the first potential to the second node QB under control of the first power signal at the first potential when the potential of the first node Q is the second potential, to charge the second node QB, and the pull-down control circuit 50 transmits the second power signal at the second potential to the second node QB when the potential of the first node Q is the first potential, to pull down the potential and reduce noise for the second node QB.

The pull-down circuit 60 is coupled to a reset signal terminal TRST, a pull-down control terminal CL, the second node QB, the second power supply terminal VGL1, a third power supply terminal VGL2, the reference node H, the first node Q, the shift output terminal OUT1, and the drive output terminal OUT2. The pull-down circuit 60 is configured to transmit the second power signal to the reference node H in response to a reset signal provided by the reset signal terminal TRST, transmit the second power signal to the first node Q in response to a pull-down control signal provided by the pull-down control terminal CL, and transmit the second power signal to the first node Q and the shift output terminal OUT1 and transmit a third power signal provided by the third power supply terminal VGL2 to the drive output terminal OUT2 in response to the potential of the second node QB.

Optionally, the pull-down control terminal CL is coupled to a shift output terminal OUT1 of a cascaded shift register unit at a next stage. A potential of the third power signal is the second potential. In addition, in the case that the valid potential is a high potential relative to the invalid potential, the potential of the third power signal is lower than the potential of the second power signal. In this way, it's ensured that noise is reduced reliably for the drive output terminal OUT2 coupled to the gate line. Certainly, the potential of the third power signal is the same as the potential of the second power signal.

For example, the pull-down control circuit 60 transmits the second power signal at the second potential to the reference node H when a potential of the reset signal provided by the reset signal terminal TRST is the first potential, to pull down the potential and reduce noise for the reference node H. In addition, when the potential of the reset signal provided by the reset signal terminal TRST is the first potential, the first clock signal terminal CLK1 is controlled simultaneously to provide the first clock signal at the first potential, that is, the compensation control circuit 20 controls the reference node H to be conducted with the first node Q. In this way, the second power signal at the second potential is further transmitted to the first node Q to reduce noise for the first node Q synchronously. The pull-down control circuit 60 further transmits the second power signal at the second potential to the first node Q when a potential of the pull-down control signal provided by the pull-down control terminal CL is the first potential, to pull down the potential and reduce noise for the first node Q. The pull-down control circuit 60 further transmits the second power signal at the second potential to the first node Q and the shift output terminal OUT1 and transmit the third power signal at the second potential to the drive output terminal OUT2 when the potential of the second node QB is the first potential, to pull down the potential and reduce noise for the first node Q, the shift output terminal OUT1, and the drive output terminal OUT2.

Figure 6:
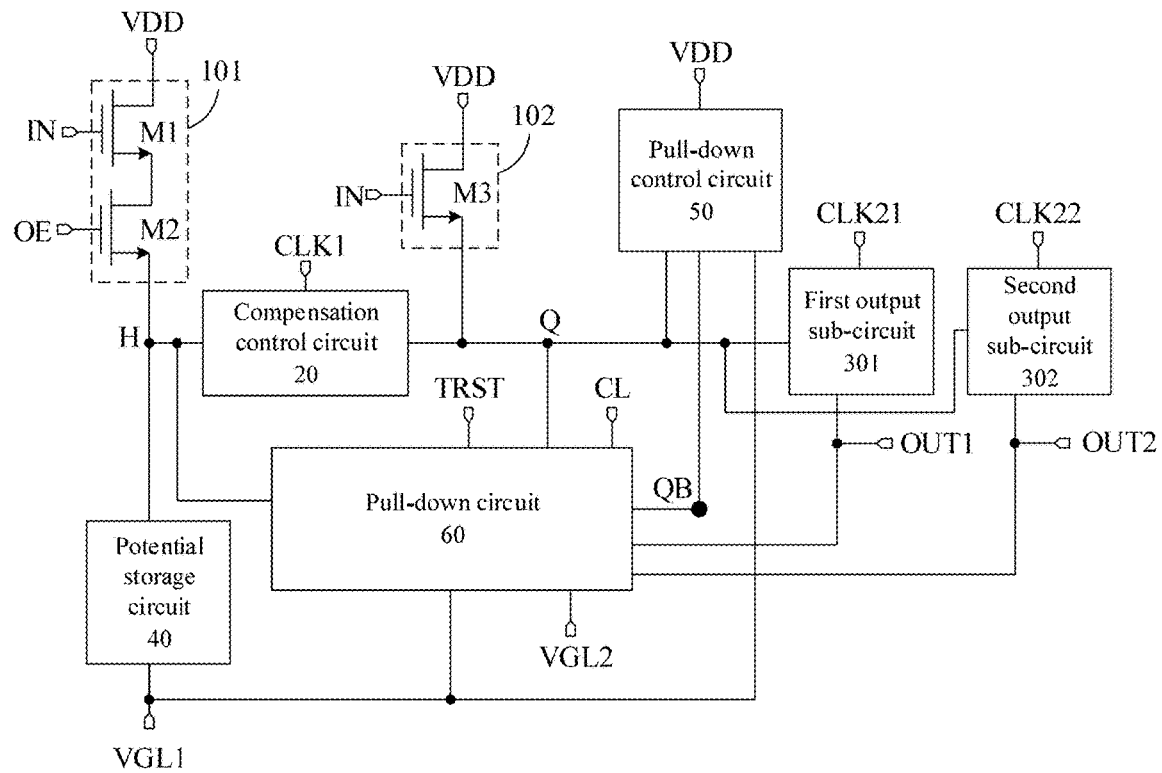
FIG. 6 is a schematic structural diagram of still another shift register unit according to some embodiments of the present disclosure.

Optionally, FIG. 6 is a schematic structural diagram of still another shift register unit according to some embodiments of the present disclosure. As shown in FIG. 6, the first input sub-circuit 101 includes a first input transistor M1 and a second input transistor M2. The second input sub-circuit 102 includes a third input transistor M3.

A gate of the first input transistor M1 is coupled to the input signal terminal IN, a first electrode of the first input transistor M1 is coupled to the first power supply terminal VDD, and a second electrode of the first input transistor M1 is coupled to a first electrode of the second input transistor M2.

A gate of the second input transistor M2 is coupled to the input control terminal OE and a second electrode of the second input transistor M2 is coupled to the reference node H.

A gate of the third input transistor M3 is coupled to the input signal terminal IN, a first electrode of the third input transistor M3 is coupled to the first power supply terminal VDD, and a second electrode of the third input transistor M3 is coupled to the first node Q.

Figure 7:
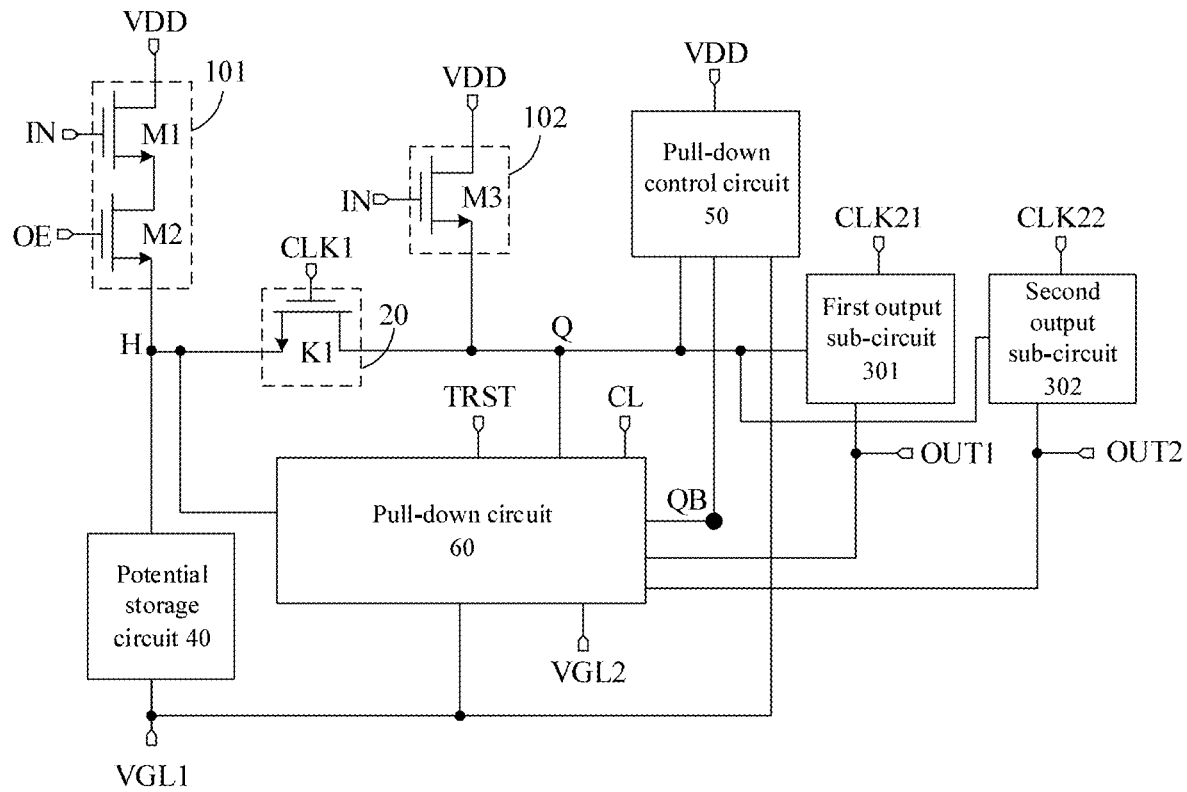
FIG. 7 is a schematic structural diagram of still another shift register unit according to some embodiments of the present disclosure.

Optionally, FIG. 7 is a schematic structural diagram of still another shift register unit according to some embodiments of the present disclosure. As shown in FIG. 7, the compensation control circuit 20 includes a compensation control transistor K1.

A gate of the compensation control transistor K1 is coupled to the first clock signal terminal CLK1, a first electrode of the compensation control transistor K1 is coupled to the reference node H, and a second electrode of the compensation control transistor K1 is coupled to the first node Q.

Figure 8:
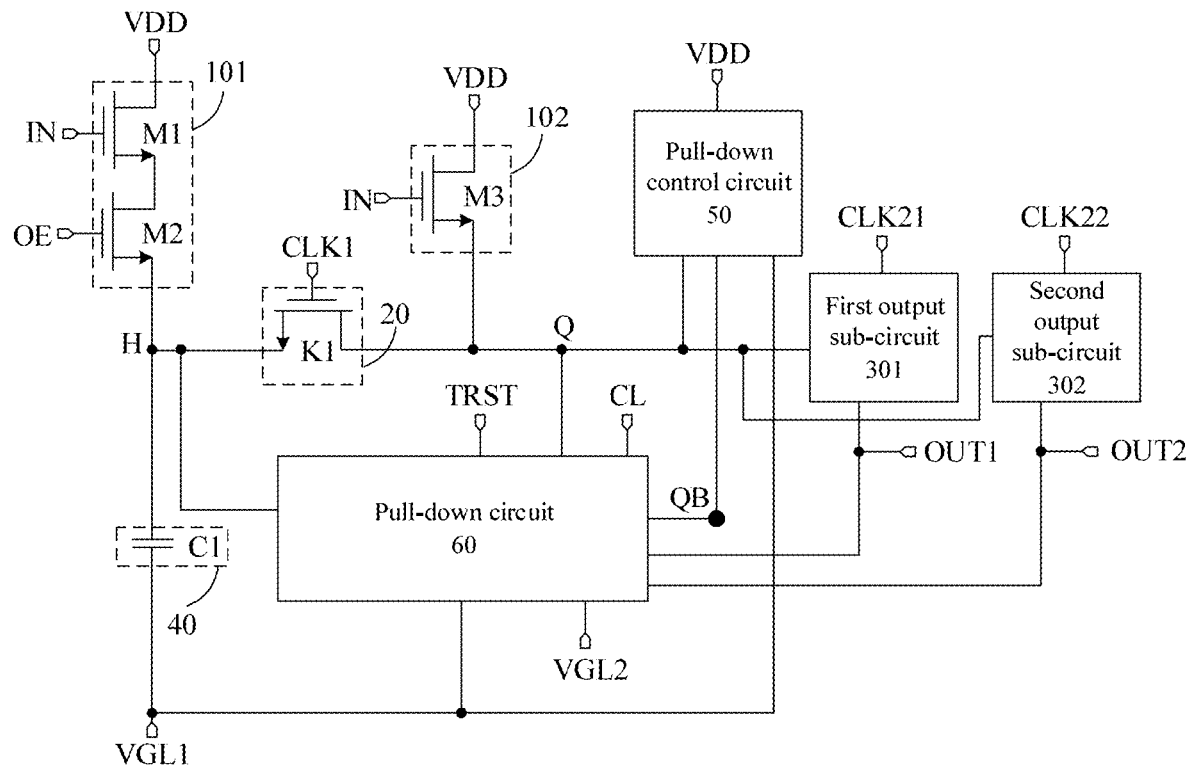
FIG. 8 is a schematic structural diagram of still another shift register unit according to some embodiments of the present disclosure.

Optionally, FIG. 8 is a schematic structural diagram of still another shift register unit according to some embodiments of the present disclosure. As shown in FIG. 8, the potential storage circuit 40 includes a storage capacitor C1.

One end of the storage capacitor C1 is coupled to the reference node H and the other end of the storage capacitor C1 is coupled to the second power supply terminal VGL1.

Figure 9:
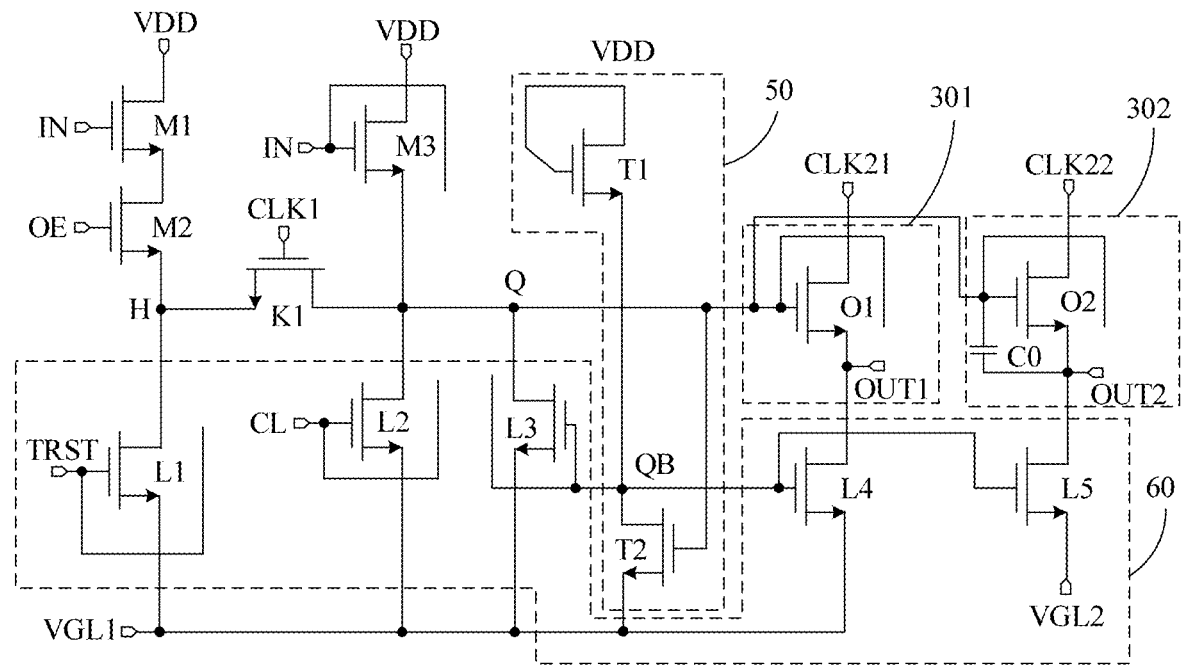
FIG. 9 is a schematic structural diagram of still another shift register unit according to some embodiments of the present disclosure.

Optionally, FIG. 9 is a schematic structural diagram of still another shift register unit according to some embodiments of the present disclosure. As shown in FIG. 9, the first output sub-circuit 301 includes a first output transistor O1.

A gate of the first output transistor O1 is coupled to the first node Q, a first electrode of the first output transistor O1 is coupled to the first clock sub-signal terminal CLK21, and a second electrode of the first output transistor O1 is coupled to the shift output terminal OUT1.

Optionally, still referring to FIG. 9, the second output sub-circuit 302 includes a second output transistor O2 and a capacitor C0.

A gate of the second output transistor O2 is coupled to the first node Q, a first electrode of the second output transistor O2 is coupled to the second clock sub-signal terminal CLK22, and a second electrode of the second output transistor O2 is coupled to the drive output terminal OUT2.

One terminal of the capacitor C0 is coupled to the first node Q and the other terminal of the capacitor C0 is coupled to the drive output terminal OUT2.

Optionally, still referring to FIG. 9, the pull-down control circuit 50 includes a first pull-down control transistor T1 and a second pull-down control transistor T2.

A gate and a first electrode of the first pull-down control transistor T1 both are coupled to the first power supply terminal VDD and a second electrode of the first pull-down control transistor T1 coupled to the second node QB.

A gate of the second pull-down control transistor T2 is coupled to the first node Q, a first electrode of the second pull-down control transistor T2 is coupled to the second power supply terminal VGL1, and a second electrode of the second pull-down control transistor T2 is coupled to the second node QB.

Optionally, still referring to FIG. 9, the pull-down circuit 60 includes a first pull-down transistor L1, a second pull-down transistor L2, a third pull-down transistor L3, a fourth pull-down transistor L4, and a fifth pull-down transistor L5.

A gate of the first pull-down transistor L1 is coupled to the reset signal terminal TRST, a first electrode of the first pull-down transistor L1 is coupled to the second power supply terminal VGL1, and a second electrode of the first pull-down transistor L1 is coupled to the reference node H.

A gate of the second pull-down transistor L2 is coupled to the pull-down control terminal CL, a first electrode of the second pull-down transistor L2 is coupled to the second power supply terminal VGL1, and a second electrode of the second pull-down transistor L2 is coupled to the first node Q.

A gate of the third pull-down transistor L3, a gate of the fourth pull-down transistor L4 and a gate of the fifth pull-down transistor L5 all are coupled to the second node QB. A first electrode of the third pull-down transistor L3 and a first electrode of the fourth pull-down transistor L4 is coupled to the second power supply terminal VGL1, and a first electrode of the fifth pull-down transistor L5 is coupled to the third power supply terminal VGL2. A second electrode of the third pull-down transistor L3 is coupled to the first node Q, a second electrode of the fourth pull-down transistor L4 is coupled to the shift output terminal OUT1, and a second electrode of the fifth pull-down transistor L5 is coupled to the drive output terminal OUT2.

In an optional implementation, in the embodiments of the present disclosure, at least one of the transistors included in the shift register unit has a bottom gate and a top gate coupled to each other. The transistor having the bottom gate and the top gate coupled to each other is referred to as a dual-gate transistor.

Figure 16:
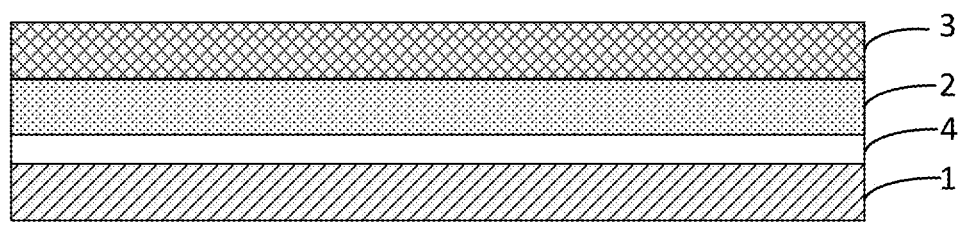
FIG. 16 is a schematic structural diagram of a transistor in the shift register unit according to some embodiments of the present disclosure.

In another optional implementation, in the embodiments of the present disclosure, at least one of the transistors included in the shift register unit has a target metal that is coupled to a source. Referring to FIG. 16, each of the transistors in the shift register unit includes a base substrate 1, a buffer layer 2 disposed on a side of the base substrate 1, and a source/drain metal layer 3, an active layer, a gate insulating layer, and a gate metal layer and other layer structures which are disposed on the side of the buffer layer 2 away from the base substrate 1. The target metal 4 of the at least one transistor is disposed between the buffer layer 2 and the base substrate 1. That is, the at least one transistor further includes the target metal disposed between the buffer layer and the base substrate in addition to the foregoing structures, and the target metal is coupled to the source.

Optionally, the transistors in the foregoing two optional implementations includes at least one type of the following transistors:
  transistors configured to control the potential of the first node Q in the input circuit 10 and the pull-down circuit 60;
  transistors configured to control the potential of the reference node H in the pull-down circuit 60; and transistors in the output circuit 30.

For example, referring to FIG. 9, the transistor configured to control the first node Q in the input circuit 10 includes the third input transistor M3 configured to transmit the first power signal to the first node Q. The transistors configured to control the first node Q in the pull-down circuit 60 include the second pull-down transistor L2 and the third pull-down transistor L3. The transistor configured to control the reference node H in the pull-down circuit 60 includes the first pull-down transistor L1. The transistors included in the output circuit 30 are the first output transistor O1 and the second output transistor O2. In addition, it can be seen with reference to FIG. 9 that the third input transistor M3, the first pull-down transistor L1, the second pull-down transistor L2, the third pull-down transistor L3, the first output transistor O1, and the second output transistor O2 are all dual-gate transistors. Therefore, the structure shown in FIG. 9 is referred to as a single-gate and dual-gate combined shift register unit.

Tests show that the threshold voltage of the dual-gate transistor or the transistor having the target metal coupled to the source is less affected by a bias voltage and temperature (especially under light illumination) than that of a single-gate transistor, that is, the dual-gate transistor or the transistor having the target metal coupled to the source has stronger bias temperature stress (BTS). In other words, the dual-gate transistor or the transistor having the target metal coupled to the source has better working stability than the single-gate transistor. In addition, the power supply current of the dual-gate transistor is 1.6 to 2 times that of the single-gate transistor on the premise that they have the same width-to-length ratio W/L (a width-to-length ratio of a channel).

In this way, by setting some of the transistors in the shift register unit to be dual-gate transistors or transistors having the target metal coupled to the source, the working stability of the shift register unit is ensured, electric leakage of the first node Q is reduced, and reliability of the shift register unit is improved without increasing sizes of the transistors, that is, on the premise of facilitating implementation of a narrow frame.

Figure 10:
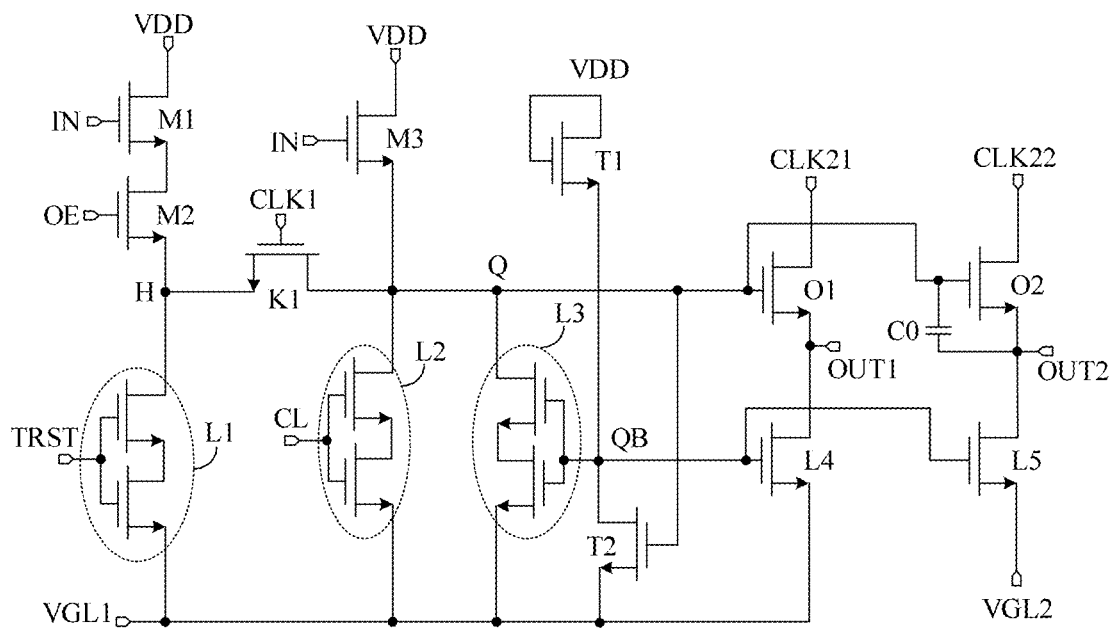
FIG. 10 is a schematic structural diagram of still another shift register unit according to some embodiments of the present disclosure.

Certainly, referring to FIG. 10, in some embodiments, some of the dual-gate transistors shown in FIG. 9 is replaced by transistors having a series-connected two-transistor (STT) structure. For example, the first pull-down transistor L1, the second pull-down transistor L2, and the third pull-down transistor L3 shown in FIG. 10 all have the STT structure.

Optionally, in the embodiments of the present disclosure, referring to FIG. 9, the channel length of a target transistor (i.e., the first pull-down control transistor T1) coupled to the first power supply terminal VDD in the pull-down control circuit 50 is greater than the channel lengths of the transistors, except the first pull-down control transistor T1, in the shift register unit.

For example, the channel lengths of the transistors except the first pull-down control transistor T1 is less than 10, and the channel length of the first pull-down control transistor T1 is greater than 10. It should be noted that the channel width of the first pull-down control transistor T1 is not limited in the embodiments of the present disclosure.

Tests show that if an initial threshold voltage Vth of a transistor is negatively biased, when the transistor is turned on for a long time, the transistor is prone to heat accumulation and is even burned, affecting working reliability of the transistor. Therefore, according to the principle that the greater the channel length of the transistor is, the higher the initial threshold voltage Vth is, setting the first pull-down control transistor T1 that is turned on for a long time under the control of the first power signal to have a greater channel length facilitates forward control of the initial threshold voltage Vth of the first pull-down control transistor T1, thereby reducing the electric leakage of the first pull-down control transistor T1 and reducing the risk that the first pull-down control transistor T1 is burned, and improving the product reliability of the first pull-down control transistor T1.

It should be noted that an example in which the transistors are N-type transistors, and the first potential is a low potential relative to the second potential is taken for descriptions in the foregoing embodiments. Certainly, the transistors is alternatively P-type transistors. When the transistors are P-type transistors, the first potential is a high potential relative to the second potential.

In summary, some embodiments of the present disclosure provide the shift register unit. The shift register unit includes the input circuit, the compensation control circuit, and the output circuit. The input circuit controls the potential of the first node under control of the input signal provided by the input signal terminal and control the potential of the reference node under control of the input signal and the input control signal provided by the input control terminal. The compensation control circuit adjusts the potential of the first node based on the potential of the reference node under control of the first clock signal provided by the first clock signal terminal. In this way, the flexibility of controlling the first node is improved. Further, the output circuit flexibly outputs the drive signal to the output terminal coupled to the gate line under control of the first node.

Figure 11:
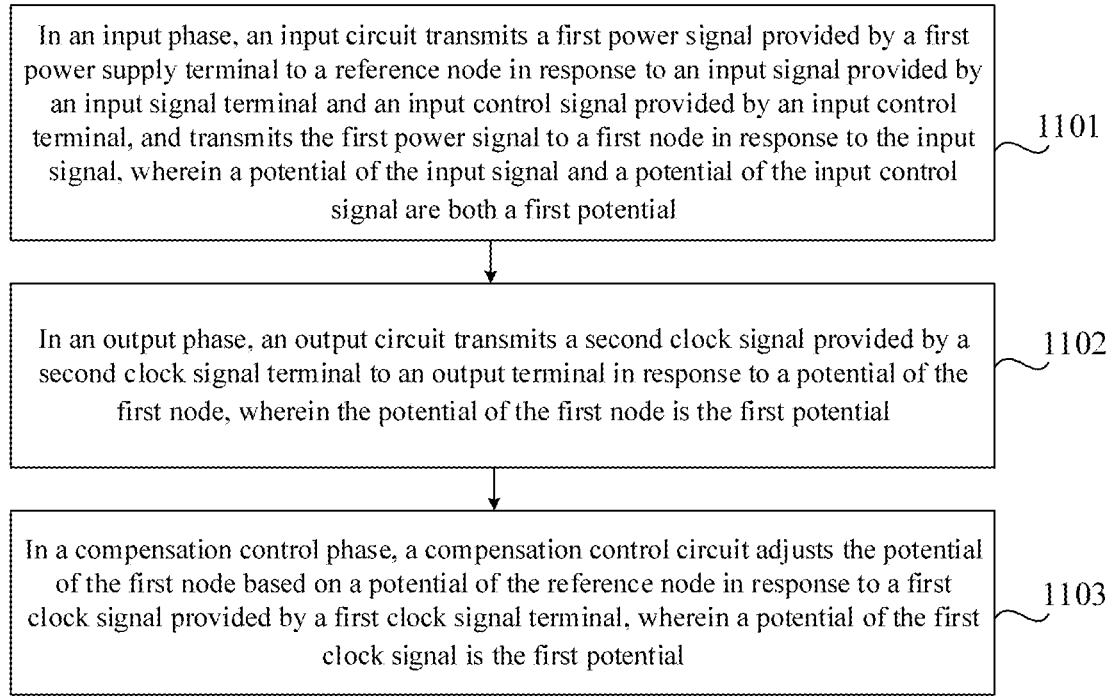
FIG. 11 is a flowchart of a method for driving a shift register unit according to some embodiments of the present disclosure.

FIG. 11 is a flowchart of a method for driving a shift register unit according to some embodiments of the present disclosure. The method is applied to drive the shift register unit shown in any one of FIG. 1 to FIG. 10. As shown in FIG. 11, the method includes the following steps.

In step 1101, in an input period, an input circuit transmits a first power signal provided by a first power supply terminal to a reference node in response to an input signal provided by an input signal terminal and an input control signal provided by an input control terminal, and transmits the first power signal to a first node in response to the input signal, wherein a potential of the input signal and a potential of the input control signal are both a first potential.

Here, a potential of the first power signal is the first potential.

In step 1102, in an output period, an output circuit transmits a second clock signal provided by a second clock signal terminal to an output terminal in response to a potential of the first node, wherein the potential of the first node is the first potential.

In step 1103, in a compensation control period, a compensation control circuit adjusts the potential of the first node based on a potential of the reference node in response to a first clock signal provided by a first clock signal terminal, wherein a potential of the first clock signal is the first potential.

In steps 1101 to 1103, the input period and the output period is performed in a display stage, and the compensation control period is performed in a blanking stage. In this way, it can be known from the analysis of the embodiments in FIG. 1 that the output circuit outputs the display drive signal in the display stage and output the compensation drive signal in the blanking stage. Optionally, the blanking stage is a field blanking stage.

In summary, some embodiments of the present disclosure provide the method for driving a shift register unit. According to this method, the input circuit controls the potential of the first node under control of the input signal provided by the input signal terminal and control the potential of the reference node under control of the input signal and the input control signal provided by the input control terminal in the input period. The compensation control circuit adjusts the potential of the first node based on the potential of the reference node under control of the first clock signal provided by the first clock signal terminal in the blanking stage. In this way, the flexibility of controlling the first node is improved. Further, the output circuit flexibly outputs the drive signal to the output terminal coupled to the gate line under control of the first node in the output period.

Optionally, referring to FIG. 5, the output terminal OUT according to the embodiments of the present disclosure includes the shift output terminal OUT1 and the drive output terminal OUT2, and the shift register unit further includes the pull-down control circuit 50 and the pull-down circuit 60. Correspondingly, referring to the flowchart of another method for driving a shift register unit in FIG. 12, it can be known that the method further includes the following steps.

In step 1104, in a first pull-down period, a pull-down circuit transmits a second power signal provided by a second power supply terminal to the first node in response to a pull-down control signal provided by a pull-down control terminal, a pull-down control circuit transmits the second power signal to a second node in response to the first power signal and the potential of the first node, and the pull-down circuit further transmits the second power signal to the first node and a shift output terminal and transmits a third power signal provided by a third power supply terminal to a drive output terminal in response to a potential of the second node, wherein a potential of the pull-down control signal is the first potential.

Here, a potential of the third power signal is a third potential.

In step 1105, in a second pull-down period, the pull-down circuit transmits the second power signal to the reference node in response to a reset signal provided by a reset signal terminal, and the compensation control circuit adjusts the potential of the first node based on the potential of the reference node in response to the first clock signal, wherein a potential of the reset signal and the potential of the first clock signal are both the first potential.

It can be known with reference to FIG. 12 that the first pull-down period is performed after the output period in the display stage. That is, step 1104 is performed after step 1102 and before step 1103. The second pull-down period is performed after the compensation control period. That is, step 1105 is performed after step 1103.

It should be noted that a gate drive circuit consisting of the shift register units according to the foregoing embodiments is driven by an m-phase clock. That is, the gate drive circuit is coupled to m clock signal terminals in total. A plurality of cascaded shift register units are divided into a plurality of groups. Each group includes m shift register units, and the m shift register units are respectively coupled to the m clock signal terminals in sequence. The clock signal terminals herein include the clock signal terminals described in the foregoing embodiments.

The principle of driving a shift register unit according to the embodiments of the present disclosure is described in detail by taking the shift register unit shown in FIG. 9 as an example. Here, m is 4, that is, the gate drive circuit is driven by a four-phase clock; and the transistors included in the shift register unit are N-type transistors, the potential of the first power signal provided by the first power supply terminal VDD is the first potential, the potential of the second power signal provided by the second power supply terminal VGL1 and the potential of the third power signal provided by the third power supply terminal VGL2 are both the second potential, and the first potential is a high potential relative to the second potential. Referring to the time sequence diagram in FIG. 13, it can be known that the drive time sequence in one scanning frame (F) is divided into a display stage T1 and a blanking stage T2. The display stage T1 includes an input period T11, an output period T12, and a first pull-down period T13. The blanking stage T2 includes a compensation control period T21 and a second pull-down period T22.

In the input period T11, the potential of the input signal provided by the input signal terminal IN (i.e., the shift output terminal OUT1 of the shift register unit at the previous stage) and the potential of the input control signal provided by the input control terminal OE are both the first potential. The first input transistor M1, the second input transistor M2, and the third input transistor M3 are all turned on. The first power signal at the first potential is transmitted to the reference node H through the first input transistor M1 and the second input transistor M2 to charge the reference node H. The first power signal at the first potential is transmitted to the first node Q through the third input transistor M3 to pre-charge the first node Q. The second pull-down control transistor T2 is turned on, and the second power signal at the second potential is transmitted to the second node QB through the second pull-down control transistor T2 to reduce noise for the second node QB. Correspondingly, the pull-down transistors coupled to the second node QB are turned off. In addition, in the input period T11, the potential of the reset signal provided by the reset signal terminal TRST, the potential of the first clock signal provided by the first clock signal terminal CLK1, the potential of the first clock sub-signal provided by the first clock sub-signal terminal CLK21, the potential of the second clock sub-signal provided by the second clock sub-signal terminal CLK22, and the potential of the pull-down control signal provided by the pull-down control terminal CL (i.e., the shift output terminal OUT1 of the shift register unit at the next stage) are all the second potential. Further, the first pull-down transistor L1, the second pull-down transistor L2, and the compensation control transistor K1 are all turned off.

In the output period T12, the potential of the input signal and the potential of the input control signal jump to the second potential, and the first input transistor M1, the second input transistor M2, and the third input transistor M3 are all turned off. At this time, the potential of the first node Q is further pulled up under the bootstrap action of the capacitor C0, and the first output transistor O1 and the second output transistor O2 are both turned on. The potential of the first clock sub-signal and the potential of the second clock sub-signal both jump to the first potential. Thus, the first clock sub-signal at the first potential is transmitted to the shift output terminal OUT1 through the first output transistor O1. The second clock sub-signal at the first potential is transmitted to the drive output terminal OUT2 through the second output transistor O2. The second clock sub-signal transmitted at this time is the display drive signal described in the foregoing embodiments. In addition, in the output period T12, the second pull-down control transistor T2 is still turned on under the control of the first node Q, and the second power signal at the second potential is still transmitted to the second node QB through the second pull-down control transistor T2 to reduce noise for the second node QB. Correspondingly, the pull-down transistors coupled to the second node QB remain turned off. In addition, the potential of the reset signal and the potential of the first clock signal are still the second potential, and the potential of the pull-down control signal jumps to a lower first potential. The first pull-down transistor L1, the second pull-down transistor L2, and the compensation control transistor K1 all remain turned off.

In the first pull-down period T13, the potential of the pull-down control signal jumps to a higher first potential, and the second pull-down transistor L2 is turned on. The second power signal at the second potential is transmitted to the first node Q through the second pull-down transistor L2 to pull down the potential and reduce noise for the first node Q. On the premise that the potential of the second node Q is pulled down, the second pull-down control transistor T2 is turned off. The first pull-down control transistor T1 is always turned on under the control of the first power signal at the first potential, and the first power signal at the first potential is transmitted to the second node QB at this time. Correspondingly, the third pull-down transistor L3, the fourth pull-down transistor L4, and the fifth pull-down transistor L5 are all turned on. The second power signal at the second potential is transmitted to the first node Q through the third pull-down transistor L3 to pull down the potential and reduce noise for the first node Q. The second power signal at the second potential is transmitted to the shift output terminal OUT1 through the fourth pull-down transistor L4 to pull down the potential and reduce noise for the shift output terminal OUT1. The third power signal at the second potential is transmitted to the drive output terminal OUT2 through the fifth pull-down transistor L5 to pull down the potential and reduce noise for the drive output terminal OUT2. In addition, in the first pull-down period T13, the potential of the input signal, the potential of the input control signal, the potential of the reset signal, and the potential of the first clock signal are still the second potential, and the first input transistor M1, the second input transistor M2, the third input transistor M3, the first pull-down transistor L1, and the compensation control transistor K1 remain turned off.

In the compensation control period T21, the potential of the first clock signal jumps to the first potential, the compensation control transistor K1 is turned on, and the potential of the reference node H is still the first potential under the control of the storage capacitor C1. The compensation control transistor K1 pulls up the potential of the first node Q to the first potential in advance again based on the potential of the reference node H. Then, the potential of the first clock signal jumps to the second potential, the potential of the first node Q is further pulled up under the bootstrap action of the capacitor C1, and the first output transistor O1 and the second output transistor O2 are both turned on. The potential of the second clock sub-signal is the first potential. Thus, the second clock sub-signal at the first potential is transmitted to the drive output terminal OUT2 through the second output transistor O2. The second clock sub-signal transmitted at this time is the compensation drive signal described in the foregoing embodiments. In addition, in the compensation control period T21, the potential of the input signal, the potential of the input control signal, the potential of the pull-down control signal, the potential of the reset signal, and the potential of the first clock sub-signal are still the second potential, and the first input transistor M1, the second input transistor M2, the third input transistor M3, the first pull-down transistor L1, the second pull-down transistor L2, and the compensation control transistor K1 remain turned off. Because the potential of the first node Q is the first potential, the second pull-down control transistor T2 is turned on, and the second power signal at the second potential is transmitted to the second node QB through the second pull-down control transistor T2 to reduce noise for the second node QB. Correspondingly, the pull-down transistors coupled to the second node QB are turned off.

In the second pull-down period T22, the potential of the reset signal jumps to the first potential, the potential of the first clock signal jumps to the first potential again, and the first pull-down transistor L1 and the compensation control transistor K1 are both turned on. The second power signal at the second potential is first transmitted to the reference node H through the first pull-down transistor L1 to pull down the potential and reduce noise for the reference node H. Then, the compensation control transistor K1 transmits the potential of the reference node H to the first node Q to pull down the potential and reduce noise for the first node Q. Further, at this time, the first pull-down control transistor T1 transmits the first power signal at the first potential to the second node QB, and the third pull-down transistor L3, the fourth pull-down transistor L4, and the fifth pull-down transistor L5 are all turned on. The second power signal at the second potential is transmitted to the first node Q through the third pull-down transistor L3 to pull down the potential and reduce noise for on the first node Q, and the first output transistor O1 and the second output transistor O2 are turned off. The second power signal at the second potential is transmitted to the shift output terminal OUT1 through the fourth pull-down transistor L4 to pull down the potential and reduce noise for the shift output terminal OUT1. The third power signal at the second potential is transmitted to the drive output terminal OUT2 through the fifth pull-down transistor L5 to pull down the potential and reduce noise for the drive output terminal OUT2. In addition, in the second pull-down period T22, the potential of the input signal, the potential of the input control signal, and the potential of the pull-down control signal are all the second potential, and the first input transistor M1, the second input transistor M2, the third input transistor M3, the second pull-down transistor L2, and the compensation control transistor K1 all remain turned off.

Figure 13:
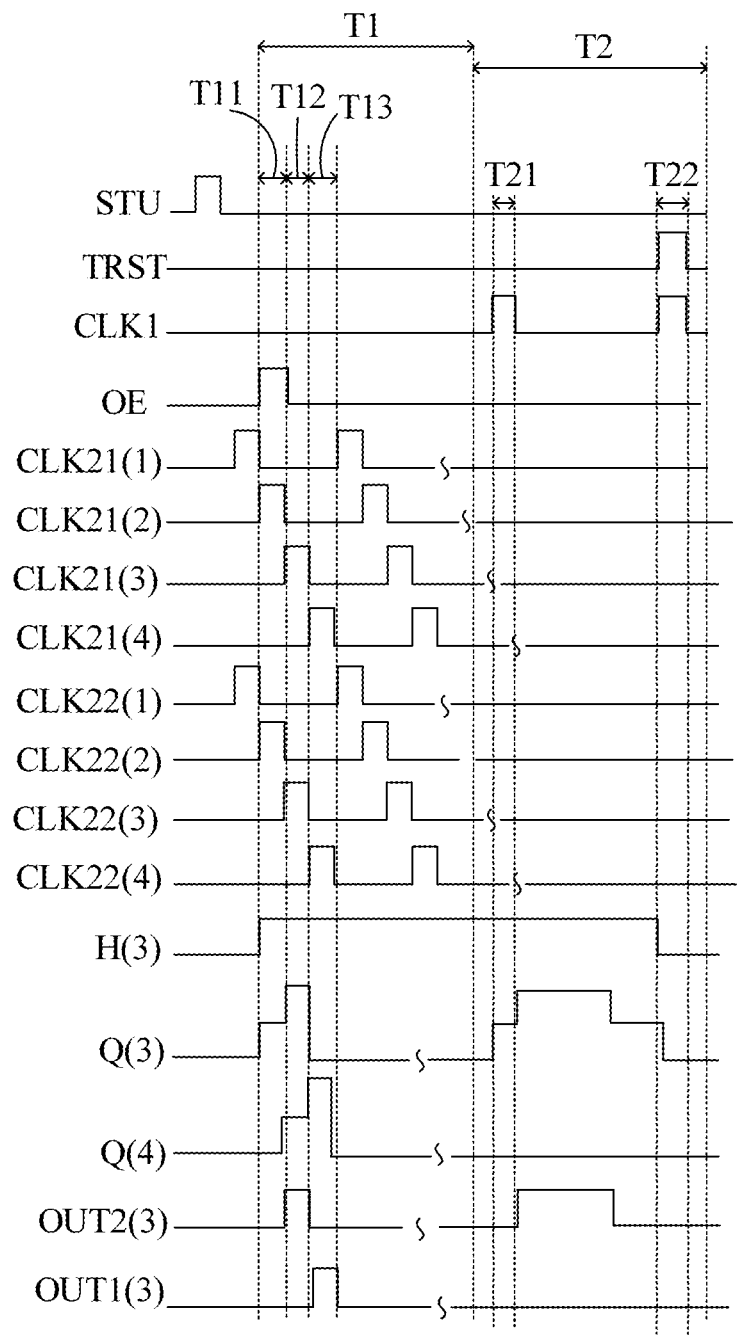
FIG. 13 is a working time sequence diagram of a shift register unit according to some embodiments of the present disclosure.

It should be noted that the time sequence diagram in FIG. 13 is a working time sequence diagram of a shift register unit at a third stage. In the figure, H (3), Q (3), CLK21 (3), CLK22(3), OUT1(3) and OUT2(3) represent the reference node H, the first node Q, the first clock sub-signal terminal CLK21, the second clock sub-signal terminal CLK22, the shift output terminal OUT1, and the drive output terminal OUT2 of the shift register unit at the third stage, respectively. A time sequence corresponding to Q (4) is a time sequence of the pull-down control terminal CL of the shift register unit at the third stage. A time sequence corresponding to CLK21(2) is a time sequence of the input signal terminal IN of the shift register unit at the third stage. FIG. 13 also shows a time sequence of an enable signal terminal STU coupled to a shift register unit at a first stage, and time sequences of other clock signal terminals in the gate drive circuit.

In summary, some embodiments of the present disclosure provide the method for driving a shift register unit. According to this method, the input circuit controls the potential of the first node under control of the input signal provided by the input signal terminal and control the potential of the reference node under control of the input signal and the input control signal provided by the input control terminal in the input period. The compensation control circuit adjusts the potential of the first node based on the potential of the reference node under control of the first clock signal provided by the first clock signal terminal in the blanking stage. In this way, the flexibility of controlling the first node is improved. Thus, the output circuit flexibly outputs the drive signal to the output terminal coupled to the gate line under control of the first node in the output period.

Figure 14:
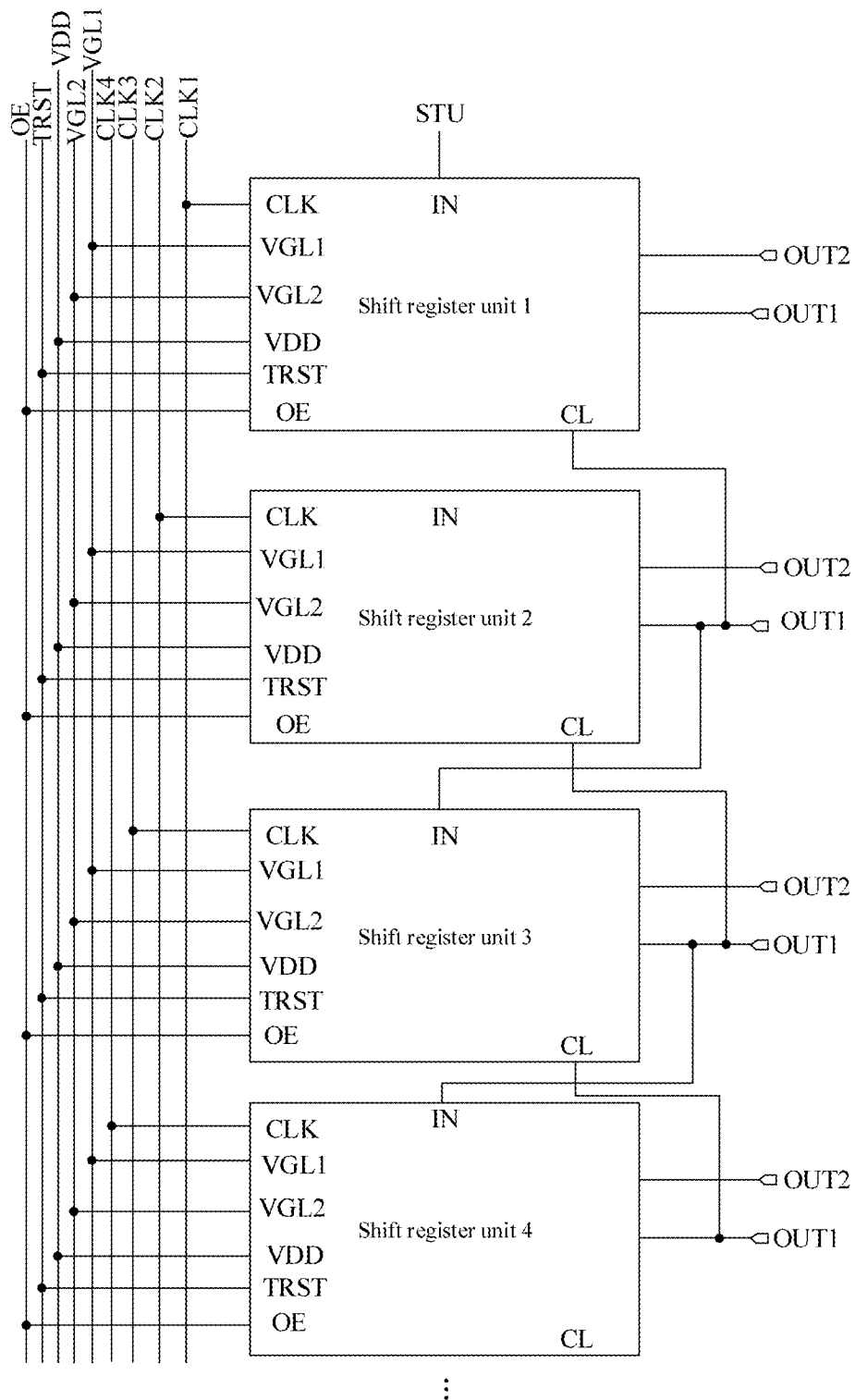
FIG. 14 is a schematic structural diagram of a gate drive circuit according to some embodiments of the present disclosure.

FIG. 14 is a schematic structural diagram of a gate drive circuit according to some embodiments of the present disclosure. As shown in FIG. 14, the gate drive circuit includes at least two cascaded shift register units. For example, FIG. 14 shows N cascaded shift register units, wherein N is an integer greater than 2. Each of the shift register units includes the shift register unit shown in any one of FIG. 1 to FIG. 10.

The drive output terminal OUT2 of the shift register unit at each stage is coupled to one gate line (not shown in FIG. 14), and the shift output terminal OUT1 of the shift register unit at each stage is coupled to the pull-down control terminal CL of the shift register unit at a previous stage and an input signal terminal IN of the shift register unit at a next stage. Certainly, the input signal terminal IN of the shift register unit at a first stage is coupled to an enable signal terminal STU. The pull-down control terminal CL of the shift register unit at a last stage is coupled to another enable signal terminal STD (not shown in FIG. 14). FIG. 14 schematically shows four cascaded shift register units.

In addition, referring to FIG. 14, the shift register unit at each stage is further coupled to the first power supply terminal VDD, the second power supply terminal VGL1, the third power supply terminal VGL2, the reset signal terminal TRST, clock signal terminals CLK (including the clock signal terminals described in the foregoing embodiments), and the input control terminal OE. Furthermore, the gate drive circuit shown in FIG. 14 is coupled to four clock signal terminals CLK1 to CLK4, and every four cascaded shift register units are respectively coupled to the four clock signal terminals CLK1 to CLK4 in sequence. Certainly, the gate drive circuit is alternatively driven by a two-phase clock or a six-phase clock, which is not limited in the embodiments of the present disclosure.

Figure 15:
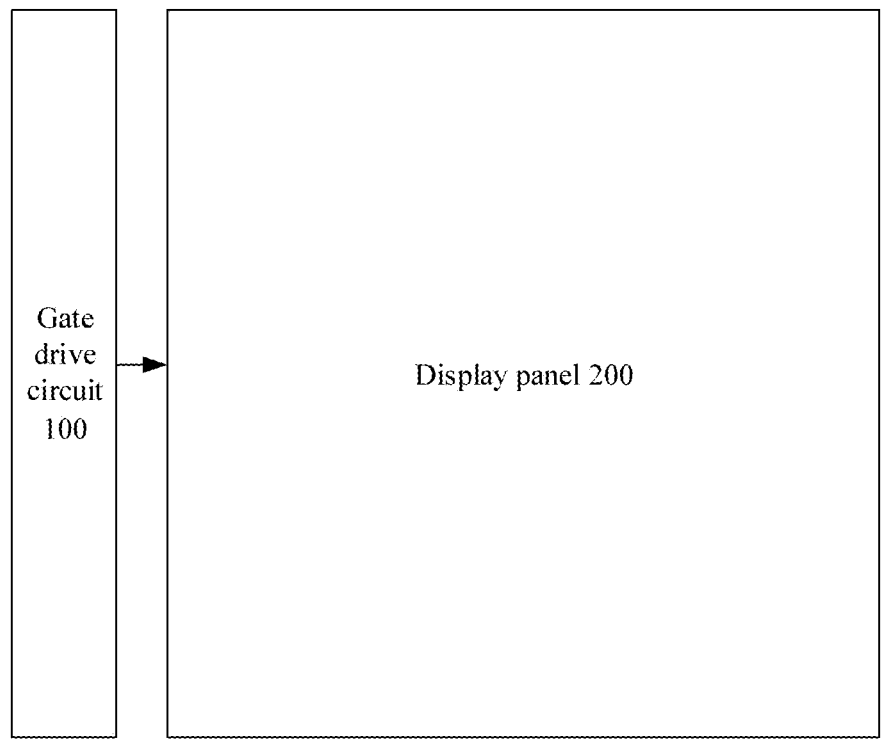
FIG. 15 is a schematic structural diagram of a display device according to some embodiments of the present disclosure.

Optionally, FIG. 15 is a schematic structural diagram of a display device according to some embodiments of the present disclosure. As shown in FIG. 15, the display device includes a display panel 200 and the gate drive circuit 100 shown in FIG. 14. The gate drive circuit 100 is coupled to a pixel circuit (not shown) in the display panel 200, and is configured to provide a gate drive signal to the pixel circuit.

In addition, in some embodiments of the present disclosure, the gate drive circuit 100 not only provides a gate drive signal for driving display in the display stage, but also provide a gate drive signal for driving compensation in the blanking stage.

Optionally, the display device further includes a source drive circuit and some external circuits, such as a field-programmable gate array (FPGA). The FPGA is coupled to the input control terminal OE and configured to provide the input control signal described in the foregoing embodiments. The source drive circuit is coupled to the pixel circuit in the display panel and configured to provide a data signal to the pixel circuit.

In addition, the gate drive circuit 100 is coupled to the pixel circuit through a gate line, and the source drive circuit is coupled to the pixel circuit through a data line.

Optionally, the display device is any product or component with a display function, such as a liquid crystal display (LCD) panel, electronic paper, an organic light-emitting diode (OLED) display panel, a mobile phone, a tablet computer, a TV, a display, a notebook computer, a digital photo frame, or a navigator.

In the embodiments of the present disclosure, the terms "first", "second", "third", and "fourth" are used only for the purpose of descriptions and should not be constructed as indicating or implying relative importance.

Persons skilled in the art can clearly understand that for convenience and brevity of descriptions, reference is made to the corresponding processes in the foregoing method embodiments for specific working processes of the gate drive circuit, the shift register unit, the circuits and sub-circuits described above. Details are not described herein again.

The foregoing descriptions are merely optional embodiments of the present disclosure and are not intended to limit the present disclosure. Any modifications, equivalent replacements, and improvements within the spirit and principles of the present disclosure shall be included within the protection scope of the present disclosure.

What is claimed is:

1. A shift register unit, comprising:
  an input circuit coupled to an input signal terminal, an input control terminal, a first power supply terminal, a reference node, and a first node, wherein the input circuit is configured to transmit a first power signal provided by the first power supply terminal to the reference node in response to an input signal provided by the input signal terminal and an input control signal provided by the input control terminal, and transmit the first power signal to the first node in response to the input signal;
  a compensation control circuit coupled to a first clock signal terminal, the reference node, and the first node, wherein the compensation control circuit is configured to adjust a potential of the first node based on a potential of the reference node in response to a first clock signal provided by the first clock signal terminal; and
  an output circuit coupled to the first node, a second clock signal terminal, and an output terminal, wherein the output circuit is configured to transmit a second clock signal provided by the second clock signal terminal to the output terminal in response to the potential of the first node,
  wherein the input circuit comprises a first input sub-circuit, and the first input sub-circuit comprises a first input transistor and a second input transistor, wherein a gate of the first input transistor is coupled to the input signal terminal, a first electrode of the first input transistor is coupled to the first power supply terminal, and a second electrode of the first input transistor is coupled to a first electrode of the second input transistor; and a gate of the second input transistor is coupled to the input control terminal, and a second electrode of the second input transistor is coupled to the reference node; and the first input sub-circuit is configured to transmit the first power signal to the reference node in response to the input signal and the input control signal.

2. The shift register unit according to claim 1, wherein at least one of a transistor in the input circuit, a transistor in the compensation control circuit, and a transistor in the output circuit comprises a top gate and a bottom gate coupled to each other.

3. The shift register unit according to claim 1, wherein at least one of a transistor in the input circuit, a transistor in the compensation control circuit, and a transistor in the output circuit comprises a target metal coupled to a source.

4. The shift register unit according to claim 1, wherein the input circuit further comprises a second input sub-circuit; wherein
the second input sub-circuit is coupled to the input signal terminal, the first power supply terminal, and the first node, and is configured to transmit the first power signal to the first node in response to the input signal.

5. The shift register unit according to claim 4, wherein the second input sub-circuit comprises a third input transistor; wherein
a gate of the third input transistor is coupled to the input signal terminal, a first electrode of the third input transistor is coupled to the first power supply terminal, and a second electrode of the third input transistor is coupled to the first node.

6. The shift register unit according to claim 1, wherein the compensation control circuit comprises a compensation control transistor; wherein
a gate of the compensation control transistor is coupled to the first clock signal terminal, a first electrode of the compensation control transistor is coupled to the reference node, and a second electrode of the compensation control transistor is coupled to the first node.

7. The shift register unit according to claim 1, further comprising a potential storage circuit; wherein
the potential storage circuit is coupled to the reference node and a second power supply terminal, and is configured to store the potential of the reference node under control of the potential of the reference node and a second power signal provided by the second power supply terminal.

8. The shift register unit according to claim 7, wherein the potential storage circuit comprises a storage capacitor; wherein
one terminal of the storage capacitor is coupled to the reference node and the other terminal of the storage capacitor is coupled to the second power supply terminal.

9. The shift register unit according to claim 1, wherein the output terminal comprises a shift output terminal and a drive output terminal; the second clock signal terminal comprises a first clock sub-signal terminal and a second clock sub-signal terminal; and the output circuit comprises a first output sub-circuit and a second output sub-circuit; wherein
the first output sub-circuit is coupled to the first node, the first clock sub-signal terminal, and the shift output terminal, and is configured to transmit a first clock sub-signal provided by the first clock sub-signal terminal to the shift output terminal in response to the potential of the first node; and
the second output sub-circuit is coupled to the first node, the second clock sub-signal terminal, and the drive output terminal, and is configured to transmit a second clock sub-signal provided by the second clock sub-signal terminal to the drive output terminal in response to the potential of the first node.

10. The shift register unit according to claim 1, wherein the output terminal comprises a shift output terminal and a drive output terminal; and the shift register unit further comprises a pull-down control circuit and a pull-down circuit; wherein
the pull-down control circuit is coupled to the first power supply terminal, the first node, a second power supply terminal, and a second node, and is configured to transmit the first power signal to the second node in response to the first power signal, and transmit a second power signal provided by the second power supply terminal to the second node in response to the potential of the first node; and
the pull-down circuit is coupled to a reset signal terminal, a pull-down control terminal, the second node, the second power supply terminal, a third power supply terminal, the reference node, the first node, the shift output terminal, and the drive output terminal, and is configured to transmit the second power signal to the reference node in response to a reset signal provided by the reset signal terminal, transmit the second power signal to the first node in response to a pull-down control signal provided by the pull-down control terminal, and transmit the second power signal to the first node and the shift output terminal and transmit a third power signal provided by the third power supply terminal to the drive output terminal in response to a potential of the second node;
wherein at least one transistor in the pull-down circuit comprises a top gate and a bottom gate coupled to each other.

11. The shift register unit according to claim 10, wherein the transistor comprising the top gate and the bottom gate coupled to each other comprises at least one type of following transistors:
transistors configured to control the potential of the first node in the input circuit and the pull-down circuit;
a transistor configured to control the potential of the reference node in the pull-down circuit; and
transistors in the output circuit.

12. The shift register unit according to claim 10, wherein a channel length of a target transistor, coupled to the first power supply terminal, in the pull-down control circuit is greater than channel lengths of transistors except the target transistor in the shift register unit.

13. A method for driving a shift register unit, applied to drive a shift register unit, wherein the shift register comprises:
an input circuit coupled to an input signal terminal, an input control terminal, a first power supply terminal, a reference node, and a first node, wherein the input circuit is configured to transmit a first power signal provided by the first power supply terminal to the reference node in response to an input signal provided by the input signal terminal and an input control signal provided by the input control terminal, and transmit the first power signal to the first node in response to the input signal;
a compensation control circuit coupled to a first clock signal terminal, the reference node, and the first node, wherein the compensation control circuit is configured to adjust a potential of the first node based on a potential of the reference node in response to a first clock signal provided by the first clock signal terminal; and
an output circuit coupled to the first node, a second clock signal terminal, and an output terminal, wherein the output circuit is configured to transmit a second clock signal provided by the second clock signal terminal to the output terminal in response to the potential of the first node,
wherein the input circuit comprises a first input sub-circuit, and the first input sub-circuit comprises a first input transistor and a second input transistor, wherein a gate of the first input transistor is coupled to the input signal terminal, a first electrode of the first input transistor is coupled to the first power supply terminal, and a second electrode of the first input transistor is coupled to a first electrode of the second input transistor; and a gate of the second input transistor is coupled to the input control terminal, and a second electrode of the second input transistor is coupled to the reference node; and the first input sub-circuit is configured to transmit the first power signal to the reference node in response to the input signal and the input control signal, and the method comprises:
in an input period, transmitting, by the input circuit, the first power signal provided by the first power supply terminal to the reference node in response to the input signal provided by the input signal terminal and the input control signal provided by the input control terminal, and transmitting, by the input circuit, the first power signal to the first node in response to the input signal, wherein a potential of the input signal, a potential of the input control signal, and a potential of the first power signal are all a first potential;
in an output period, transmitting, by the output circuit, the second clock signal provided by the second clock signal terminal to the output terminal in response to the potential of the first node, wherein the potential of the first node is the first potential; and
in a compensation control period, adjusting, by the compensation control circuit, the potential of the first node based on the potential of the reference node in response to the first clock signal provided by the first clock signal terminal, wherein a potential of the first clock signal is the first potential;
wherein the input period and the output period are performed in a display stage, and the compensation control period is performed in a blanking stage.

14. The method according to claim 13, wherein the output terminal comprises a shift output terminal and a drive output terminal; and the method further comprises:
in a first pull-down period, transmitting, by a pull-down circuit, a second power signal provided by a second power supply terminal to the first node in response to a pull-down control signal provided by a pull-down control terminal; transmitting, by a pull-down control circuit, the second power signal to a second node in response to the first power signal and the potential of the first node; and further transmitting, by the pull-down circuit, the second power signal to the first node and the shift output terminal and a third power signal provided by a third power supply terminal to the drive output terminal in response to a potential of the second node, wherein a potential of the pull-down control signal is the first potential, and a potential of the third power signal is a third potential; and
in a second pull-down period, transmitting, by the pull-down circuit, the second power signal to the reference node in response to a reset signal provided by a reset signal terminal; and adjusting, by the compensation control circuit, the potential of the first node based on the potential of the reference node in response to the first clock signal, wherein a potential of the reset signal and the potential of the first clock signal are both the first potential;
wherein the first pull-down period is performed in the display stage and after the output period; and the second pull-down period is performed in the blanking stage and after the compensation control period.

15. A gate drive circuit, comprising at least two cascaded shift register units, wherein the shift register comprises:
an input circuit coupled to an input signal terminal, an input control terminal, a first power supply terminal, a reference node, and a first node, wherein the input circuit is configured to transmit a first power signal provided by the first power supply terminal to the reference node in response to an input signal provided by the input signal terminal and an input control signal provided by the input control terminal, and transmit the first power signal to the first node in response to the input signal;
a compensation control circuit coupled to a first clock signal terminal, the reference node, and the first node, wherein the compensation control circuit is configured to adjust a potential of the first node based on a potential of the reference node in response to a first clock signal provided by the first clock signal terminal; and
an output circuit coupled to the first node, a second clock signal terminal, and an output terminal, wherein the output circuit is configured to transmit a second clock signal provided by the second clock signal terminal to the output terminal in response to the potential of the first node,
wherein the input circuit comprises a first input sub-circuit, and the first input sub-circuit comprises a first input transistor and a second input transistor, wherein a gate of the first input transistor is coupled to the input signal terminal, a first electrode of the first input transistor is coupled to the first power supply terminal, and a second electrode of the first input transistor is coupled to a first electrode of the second input transistor; and a gate of the second input transistor is coupled to the input control terminal, and a second electrode of the second input transistor is coupled to the reference node; and the first input sub-circuit is configured to transmit the first power signal to the reference node in response to the input signal and the input control signal.

16. A display device, comprising a display panel and the gate drive circuit according to claim 15; wherein
the gate drive circuit is coupled to a pixel circuit in the display panel, and is configured to provide a gate drive signal to the pixel circuit.

17. The shift register unit according to claim 1, wherein the output terminal comprises a shift output terminal and a drive output terminal; and the shift register unit further comprises a pull-down control circuit and a pull-down circuit; wherein
the pull-down control circuit is coupled to the first power supply terminal, the first node, a second power supply terminal, and a second node, and is configured to transmit the first power signal to the second node in response to the first power signal, and transmit a second power signal provided by the second power supply terminal to the second node in response to the potential of the first node; and
the pull-down circuit is coupled to a reset signal terminal, a pull-down control terminal, the second node, the second power supply terminal, a third power supply terminal, the reference node, the first node, the shift output terminal, and the drive output terminal, and is configured to transmit the second power signal to the reference node in response to a reset signal provided by the reset signal terminal, transmit the second power signal to the first node in response to a pull-down control signal provided by the pull-down control terminal, and transmit the second power signal to the first node and the shift output terminal and transmit a third power signal provided by the third power supply terminal to the drive output terminal in response to a potential of the second node;

wherein at least one transistor in the pull-down circuit comprises a target metal coupled to a source.

18. The shift register unit according to claim 17, wherein the transistor comprising the target metal coupled to the source in the shift register unit comprises at least one type of following transistors:

transistors configured to control the potential of the first node in the input circuit and the pull-down circuit;

a transistor configured to control the potential of the reference node in the pull-down circuit; and transistors in the output circuit.

19. The gate drive circuit according to claim 15, wherein at least one of a transistor in the input circuit, a transistor in the compensation control circuit, and a transistor in the output circuit comprises a top gate and a bottom gate coupled to each other.

20. The gate drive circuit according to claim 15, wherein at least one of a transistor in the input circuit, a transistor in the compensation control circuit, and a transistor in the output circuit comprises a target metal coupled to a source.

* * * * *